US007337911B2

(12) United States Patent
Wu et al.

(10) Patent No.: US 7,337,911 B2
(45) Date of Patent: Mar. 4, 2008

(54) CLEAN CONTAINER MODULE

(75) Inventors: Tzong-Ming Wu, Taipei (TW); Tien-Lu Ho, Ta Li (TW)

(73) Assignee: Industrial Technology Research Institute, Hsinchu (TW)

( * ) Notice: Subject to any disclaimer, the term of this patent is extended or adjusted under 35 U.S.C. 154(b) by 507 days.

(21) Appl. No.: 10/984,926

(22) Filed: Nov. 10, 2004

(65) Prior Publication Data
US 2006/0032786 A1 Feb. 16, 2006

(30) Foreign Application Priority Data
Aug. 16, 2004 (TW) ............................... 93124536 A

(51) Int. Cl.
*A47F 7/00* (2006.01)
(52) U.S. Cl. ........................................................ 211/26
(58) Field of Classification Search .................. 211/26, 211/189, 41, 41.1, 41.18; 361/685; 206/485, 206/711, 454, 213.1
See application file for complete search history.

(56) References Cited

U.S. PATENT DOCUMENTS

| 4,702,535 | A | * | 10/1987 | Beun ........................... 312/308 |
| 5,247,427 | A | * | 9/1993 | Driscoll et al. ............. 361/685 |
| 5,584,396 | A | * | 12/1996 | Schmitt ....................... 211/26 |
| 6,010,008 | A | | 1/2000 | Nyseth et al. |

\* cited by examiner

*Primary Examiner*—Sarah Purol
(74) *Attorney, Agent, or Firm*—Rabin & Berdo, P.C.

(57) ABSTRACT

Disclosed is a clean container module, which includes a container body with a front opening, a rack inserted through the front opening into the inside of the container body, a top access board provided above the top panel of the container body, a bottom access board provided below the bottom panel of the container body, and the rack affix to the top access board and the bottom access board. Therefore, the rack, the top access board, and the bottom access board can provide a reasonable effect force transferring path when carrying the load, preventing obstruction of precision due to deformation of the container body during transportation. Further, the rack, the top access board, and the bottom access board can provide a satisfactory electrostatic protection.

20 Claims, 6 Drawing Sheets

CLEAN CONTAINER MODULE

BACKGROUND OF THE INVENTION

1. Field of the Invention

The present invention relates to a cleaning container module and more particularly, to a robust, precise, airtight, electrostatically protective clean container module, which provides a reasonable effect force transferring path when carrying the load, preventing obstruction of precision due to deformation of the container body and ESD protection function during process transportation, and storage.

2. Description of Related Art

In a SMIF (Standard Mechanical Interface) semiconductor factory or foundry, wafer cassettes are commonly used for carrying wafers in horizontal at different elevations. A wafer cassette has a number of support flanges for bearing wafers in horizontal at different elevations. The wafer cassette is set in a clean container module, and then the cover of the clean container module is closed to protect loaded wafers against contaminants such as, moisture in cleanroom and other environment and airborne particles, for further intrabay/interbay process transportation or storage.

FIG. 1 is an exploded view of a prior art clean container module for this purpose. As illustrated, the clean container module comprises a container body 91, a top access board 92, and a wafer cassette 93. The container body 91 has a top mounting aperture 913 in the top panel 911, and a bottom mounting aperture 914 in the bottom panel 912. The wafer cassette 93 is inserted through the bottom mounting aperture 914 into the interior 910 of the container body 91. The top access board 92 is inserted through the top mounting aperture 913 and affixed to the top connecting member 931 of the wafer cassette 93.

The design of the top mounting aperture 913 in the top panel 911 and the bottom mounting aperture 914 in the bottom panel 912 greatly complicates the manufacturing and assembly process of the container body 91, and may obstruct the structural strength of the container body 91. Further, the big top mounting aperture 913 and bottom mounting aperture 914 of the container body 91 affects the airtight arrangement of the interior 910 of the container body 91. Exterior moisture or airborne particles may pass through gaps in the top mounting aperture 913 and bottom mounting aperture 914 of the container body 91 to contaminate storage wafers. In order to eliminate this problem, additional gasket rings or sealing means shall be installed to maintain the interior 910 of the container body 91 in an airtight status. Further, due to many dead corners are created inside the container body 91, it is difficult to clean the clean container and to dry the parts of the clean container module after cleaning.

SUMMARY OF THE INVENTION

The present invention has been accomplished under the circumstances in view. It is therefore the main object of the present invention to provide a clean container module, which provides a reasonable effect force transferring path when carrying the load, preventing obstruction of precision due to deformation of the container body during transportation. It is still another object of the present invention to provide a clean container module, which provides a satisfactory electrostatic protection. It is still another object of the present invention to provide a clean container module, which facilitates performance of cleaning and drying maintenance works. To achieve these and other objects of the present invention, the clean container module comprises a container body, a rack, a top access board, and a bottom access board. The container body comprises an inside receiving chamber, a front opening in communication with the inside receiving chamber, a top panel, and a bottom panel. The top panel and the bottom panel of the container body each have a plurality of through holes in communication with the inside receiving chamber respectively. The rack is mounted inside the inside receiving chamber of the container body, comprising a horizontal top panel and two upright side panels perpendicularly downwardly extended from two distal ends of the horizontal top panel of the rack. The horizontal top panel of the rack has a plurality of upwardly mounting devices. The two upright side panels of the rack each have an inner side, a plurality of horizontal insertion slots arranged at different elevations at the inner, a bottom side, and a plurality of mounting devices downwardly extended from the bottom side. The top access board is provided above the top panel of the container body, comprising a plurality of fastening devices respectively inserted through the corresponding through holes of the top panel of the container body and respectively fastened to the corresponding mounting devices of the horizontal top panel of the rack. The bottom access board is provided below the bottom panel of the container body, comprising a plurality of fastening devices symmetrically disposed near the two opposite lateral sides thereof and respectively inserted through the corresponding through holes of the bottom panel of the container body and respectively fastened to the corresponding mounting devices of the two upright side panels of the rack.

The rack is inserted through the front opening of the container body into the inside of the inside receiving chamber and then fixedly fastened to the top access board and the bottom access board. Therefore, it is not necessary to make additional opening or aperture in the container body for accommodating the rack. Subject to the aforesaid design, the container body is easy to manufacture and assemble. After installation of the other parts of the clean container module, the structural strength of the container body is kept intact. Because only a limited number of through holes are formed in the container body, the inside receiving chamber can be maintained in a good airtight status after closing of the front opening of the container body, preventing exterior moisture or airborne particles from passing to the interior of the inside receiving chamber. Further, the new concept of the modularized design of the rack shows a significant effect to the improvement of the quality of the clean container module and allowing optimal use of materials, so as to lower the manufacturing cost of the clean container module. Further, because only a limited number of through holes are formed in the container body, there is no dead corner in the container body, and the container body can easily be cleaned and dried with cleaning and drying apparatus.

Further, the top access board, the rack, and the bottom access board can be made of conductive material, thereby forming an ESD (electrostatic discharge) path to ground through the machine interface. Therefore, electrostatic protection of the clean container module is well established.

Further, the rack can be made having a horizontal bottom panel connected between the two upright side panels at the bottom. The horizontal top panel, the horizontal bottom panel, and the two upright side panels of the rack can be formed in integrity.

DETAILED DESCRIPTION OF THE PREFERRED EMBODIMENT

Figure 1:
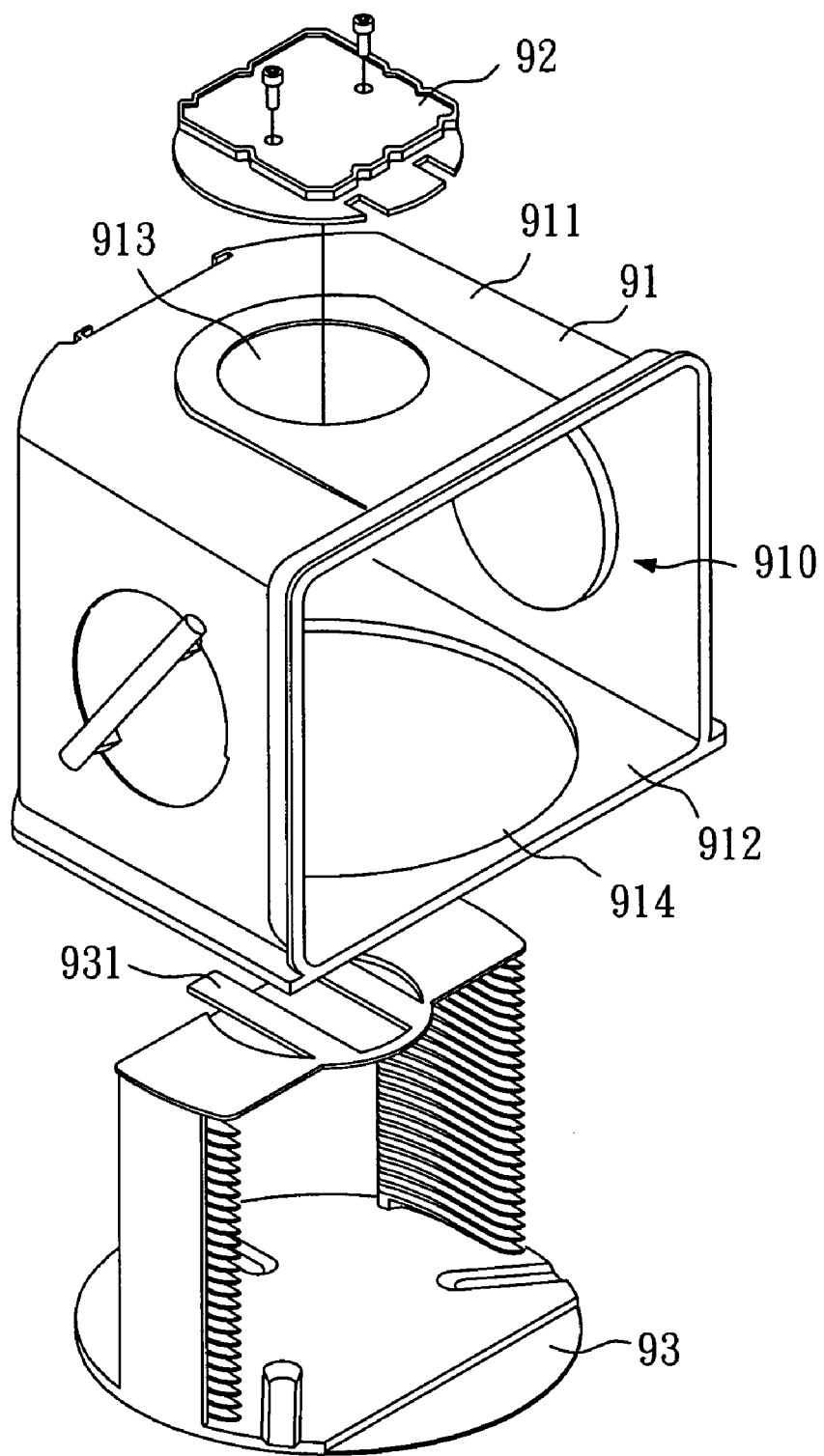
FIG. 1 is an exploded view of a clean container module according to the prior art.
Figure 2:
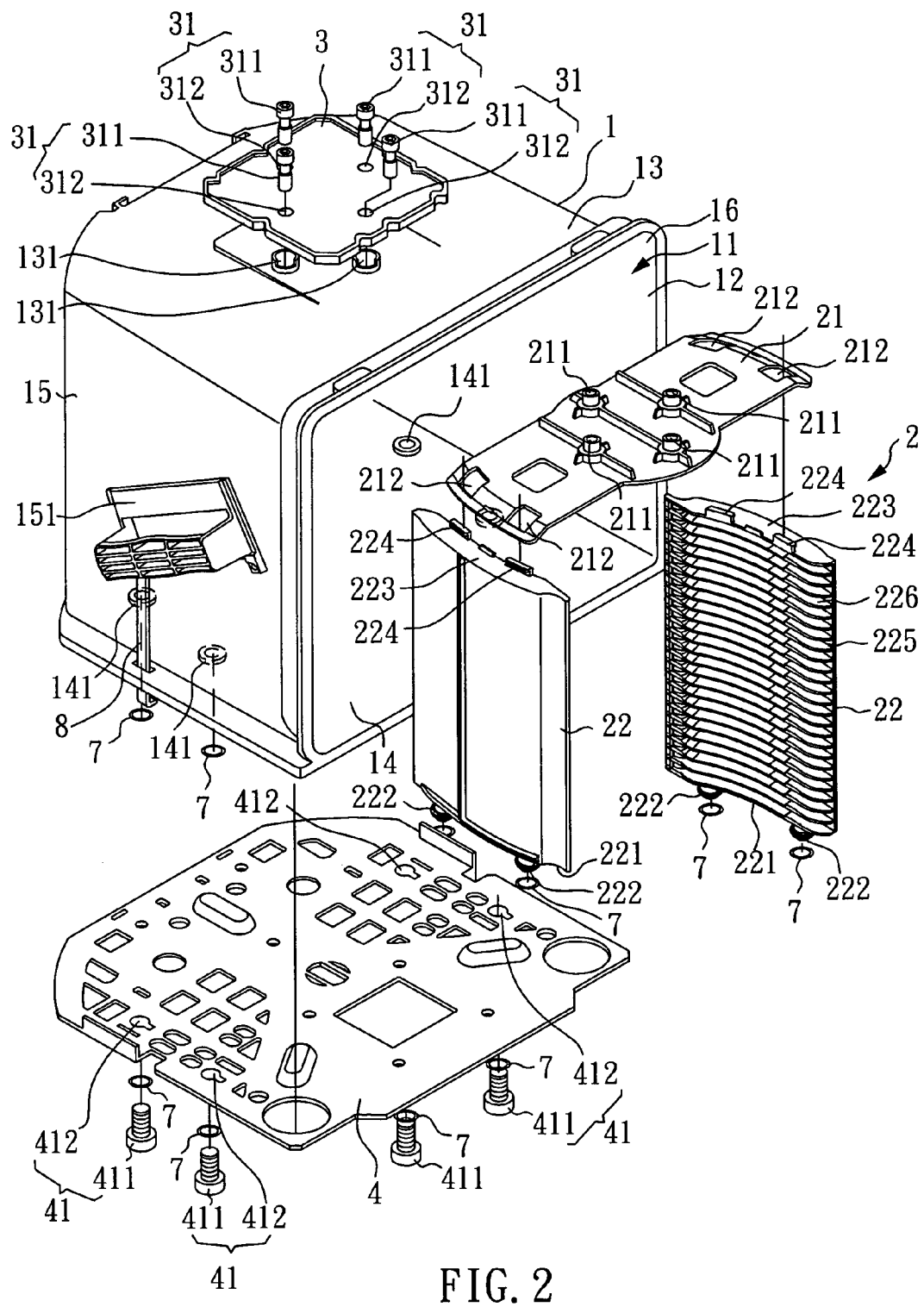
FIG. 2 is an exploded view of a clean container module according to the first embodiment of the present invention.
Figure 3:
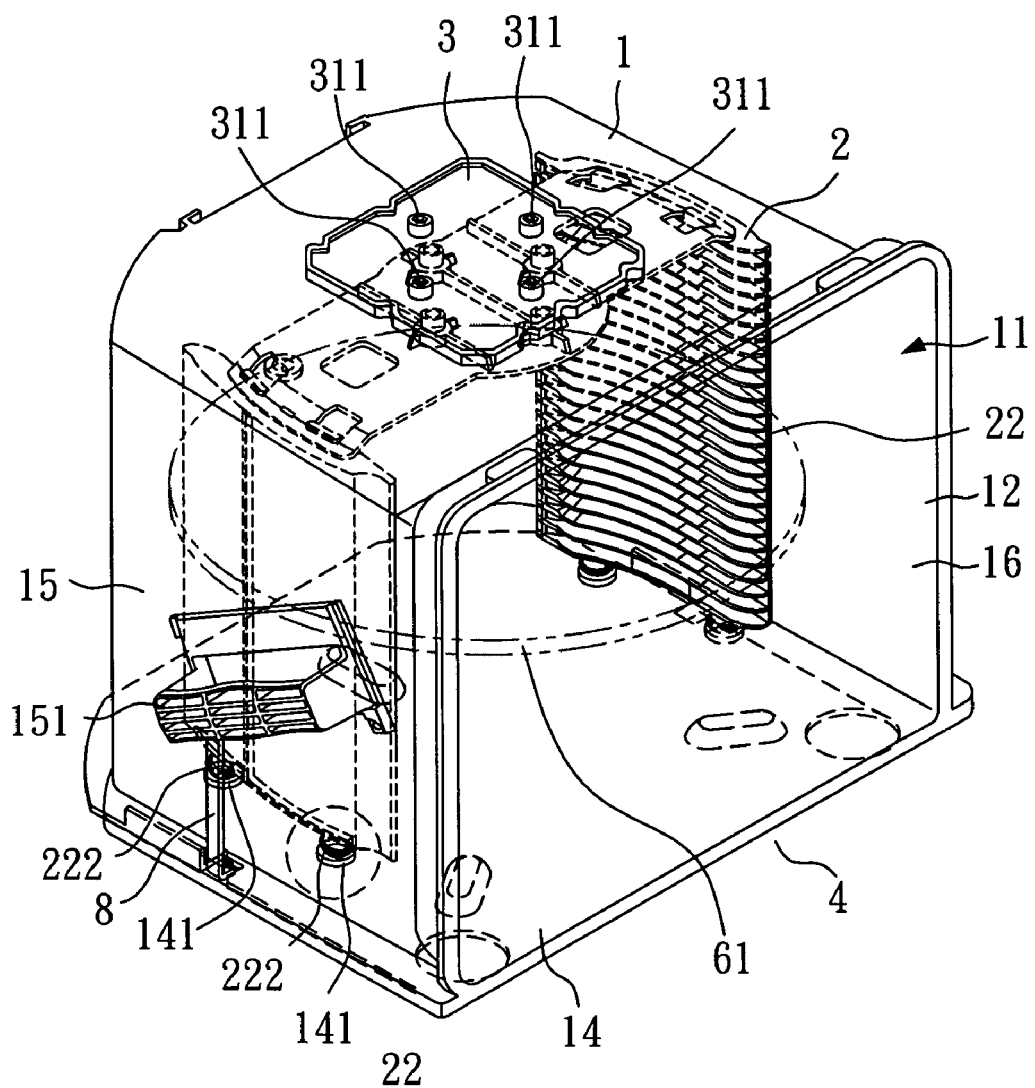
FIG. 3 is a perspective assembly view of the clean container module according to the first embodiment of the present invention.
Figure 4:
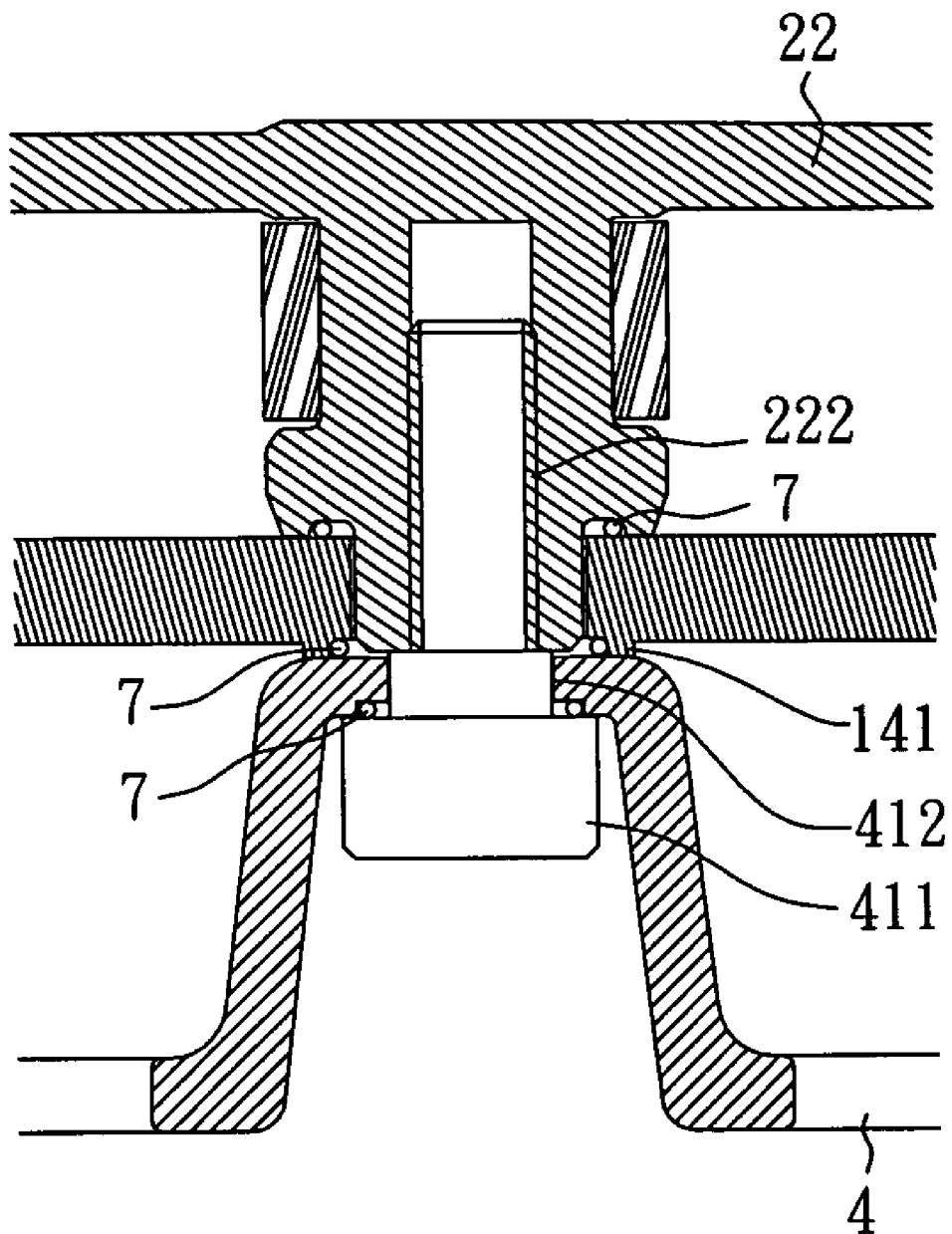
FIG. 4 is a sectional view in an enlarged scale of a part of FIG. 3.

Referring to FIG. 2~FIG. 4, a clean container module in accordance with the first embodiment of the present invention is shown comprised of a container body 1, a rack 2, a top access board 3, and a bottom access board 4.

The container body 1 comprises an inside receiving chamber 11, a front opening 12, a top panel 13, a bottom panel 14, a left-side panel 15, a right-side panel 16, a left-side handle 151 provided at the outside wall of the left-side panel 15, a right-side handle (not shown) provided at the outside wall of the right-side panel 16, a plurality of top through holes 131 through the top panel 13, and a plurality of bottom through holes 141 through the bottom panel 14.

The rack 2 according to this embodiment is a wafer cassette insertable through the front opening 12 into the inside of the inside receiving chamber 11 for holding wafers 61 inside the container body 1, comprising a transversely extended (horizontal) top panel 21 and two upright side panels 22 perpendicularly downwardly extended from the two distal ends of the top panel 21. The two upright side panels 22 each have an inner side 225 and a plurality of horizontal insertion slots 226 arranged at different elevations at the inner side 225 for receiving wafers 61 at different elevations. The top panel 21 has a plurality of upwardly mounting devices 211. The two upright side panels 22 each further have a bottom side 221 and a plurality of mounting devices 222 downwardly extended from the bottom side 221. According to this embodiment, the mounting devices 211 and 222 are screw holes.

The top access board 3 is provided above the top panel 13 of the container body 1, comprising a plurality of fastening devices 31. Each fastening device 31 comprises a through hole 312 cut through the top and bottom walls of the top access board 3, and a screw bolt 311 inserted through the corresponding through hole 312 and one corresponding top through hole 131 of the container body 1 and threaded into one corresponding mounting device (screw hole) 211 at the top panel 21 of the rack 2.

The bottom access board 4 is provided below the bottom panel 14 of the container body 1, comprising a plurality of fastening devices 41 symmetrically disposed near the two opposite lateral sides thereof. Each fastening device 41 comprises a through hole 412 cut through the top and bottom walls of the bottom access board 4, and a screw bolt 411 inserted through the corresponding through hole 412 and one corresponding bottom through hole 141 of the container body 1 and threaded into one corresponding mounting device (screw hole) 222 at the bottom side 221 of one upright side panel 22 of the rack 2.

During assembly process, a left-side grounding member 8 and a right-side grounding member (not shown) are respectively bilaterally connected between the left-side handle 151 and right-side handle (not shown) and the bottom access board 4. The left-side grounding member 8, the right-side grounding member, the left-side handle 151, and the right-side handle are made of conductive material. Further, O-rings 7 are respectively mounted in between each fastening device 31 at the top access board 3 and the corresponding mounting device (screw hole) 211 at the top panel 21 of the rack 2, and in between each fastening device 41 at the bottom access board 4 and the corresponding mounting device (screw hole) 222 at the bottom side 221 of the corresponding upright side panel 22 of the rack 2, to seal the inside receiving chamber 11 of the container body 1

After assembly of the clean container module, the top access board 3 and the bottom access board 4 are directly affixed to the rack 2. Therefore, when applying a force to the top access board 3, the rack 2 directly receives the applied force, and the container body 1 receives no pressure from the applied force. Because the applied force gives no pressure to the container body 1, the container body 1 is free from the interference of the applied force, i.e., applying a force to the top access board 3 does not cause deformation of the container body 1 or damage to the precision function of the rack 2.

As indicated above, the rack 2 is inserted through the front opening 12 of the container body 1 into the inside of the inside receiving chamber 11 and then fixedly connected to the top access board 3 and the bottom access board 4. Therefore, it is not necessary to make additional opening or aperture in the container body for accommodating the rack (wafer cassette). Subject to the aforesaid design, the container body 1 is easy to manufacture and assemble. After installation of the other parts of the clean container module, the structural strength of the container body 1 is kept intact. Because only a limited number of through holes are formed in the container body 1, the inside receiving chamber 11 can be maintained in a good airtight status after closing of the front opening 12 of the container body 1, preventing exterior moisture or airborne particles from passing to the inside of the inside receiving chamber 11. Further, the new concept of the modularized design of the rack 2 shows a significant effect to the improvement of the quality of the clean container module and lowering of the manufacturing cost of the clean container. Further, because only a limited number of through holes are formed in the container body 1, there is no dead corner in the container body 1, and the container body 1 can easily be cleaned and dried with cleaning and drying apparatus.

Referring to FIG. 2 again, the top panel 21 of the rack 2 has two pairs of retaining holes 212 respectively symmetrically disposed near the two distal ends. The two upright side panels 22 of the rack 2 each further have a top side 223 and two retaining hooks 224 respectively upwardly extended from the top side 223 and respectively hooked in the retaining holes 212 at the top panel 21 of the rack 2. According to this embodiment, the top panel 21 and the two upright side panels 22 are separately made and then fastened together. Alternatively, the two upright side panels 22 can be formed integral with the two distal ends of the top panel 21.

Referring to FIG. 3 again, the rack 2 according to this embodiment is made of more expensive abrasion resistant and static dissipative materials, for example, PEI (polyetherimide) added with carbon fiber, thereby forming an ESD (electrostatic discharge). Alternatively, PEEK (polyetheretherketon) may be used and added with carbon fiber for making the rack 2. By means of the aforesaid design, electrostatic protection is well done for the container body 1 and the rack 2. The top access board 3 and the bottom access board 4 can also be made of conductive material to enhance electrostatic protection function. Further, the left-side handle 151 and the right-side handle (not shown) are matched with the left-side grounding member 8 and the right-side grounding member (not shown) to enhance electrostatic protection function of handle.

Figure 5:
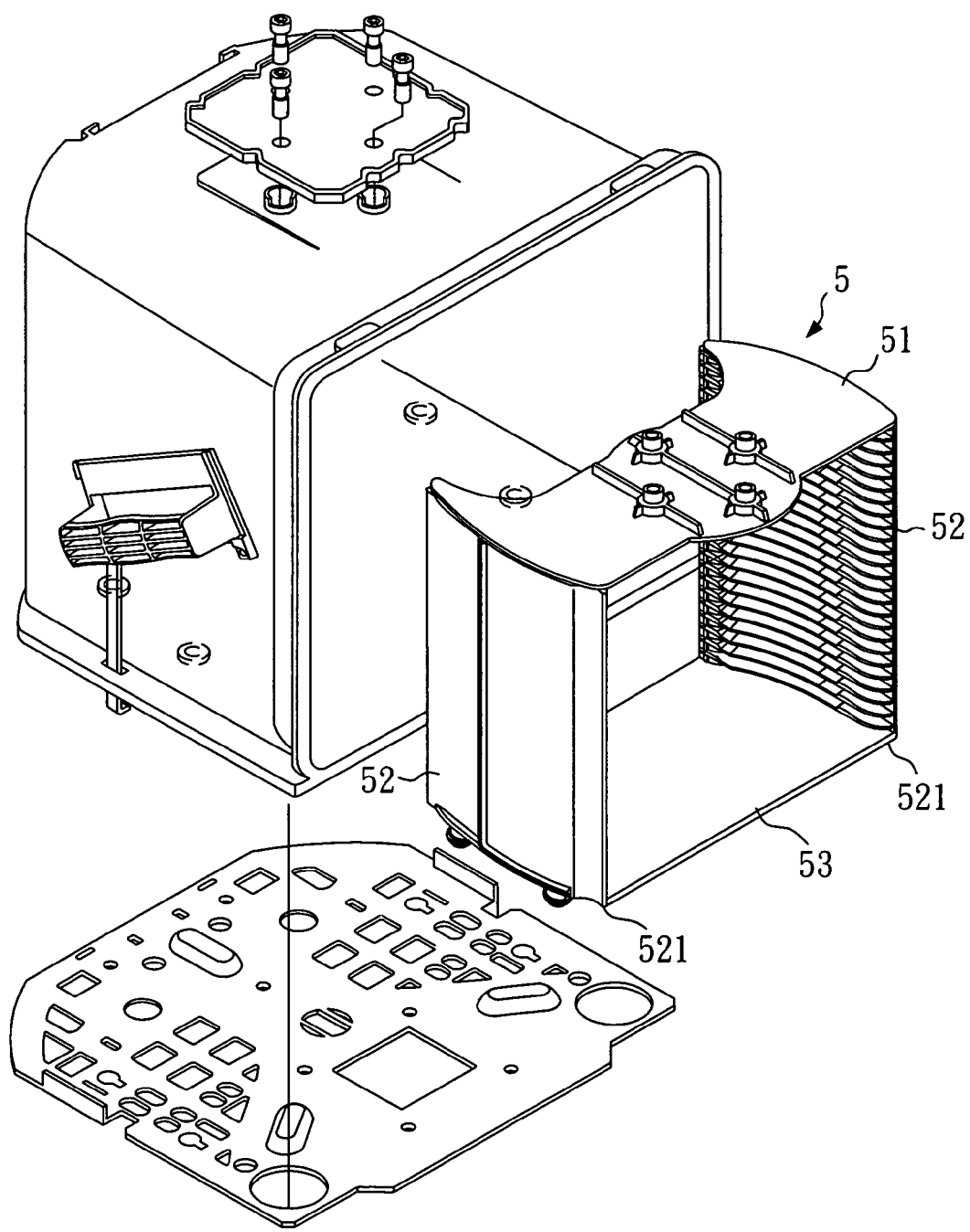
FIG. 5 is an exploded view of a clean container module according to the second embodiment of the present invention.
Figure 6:
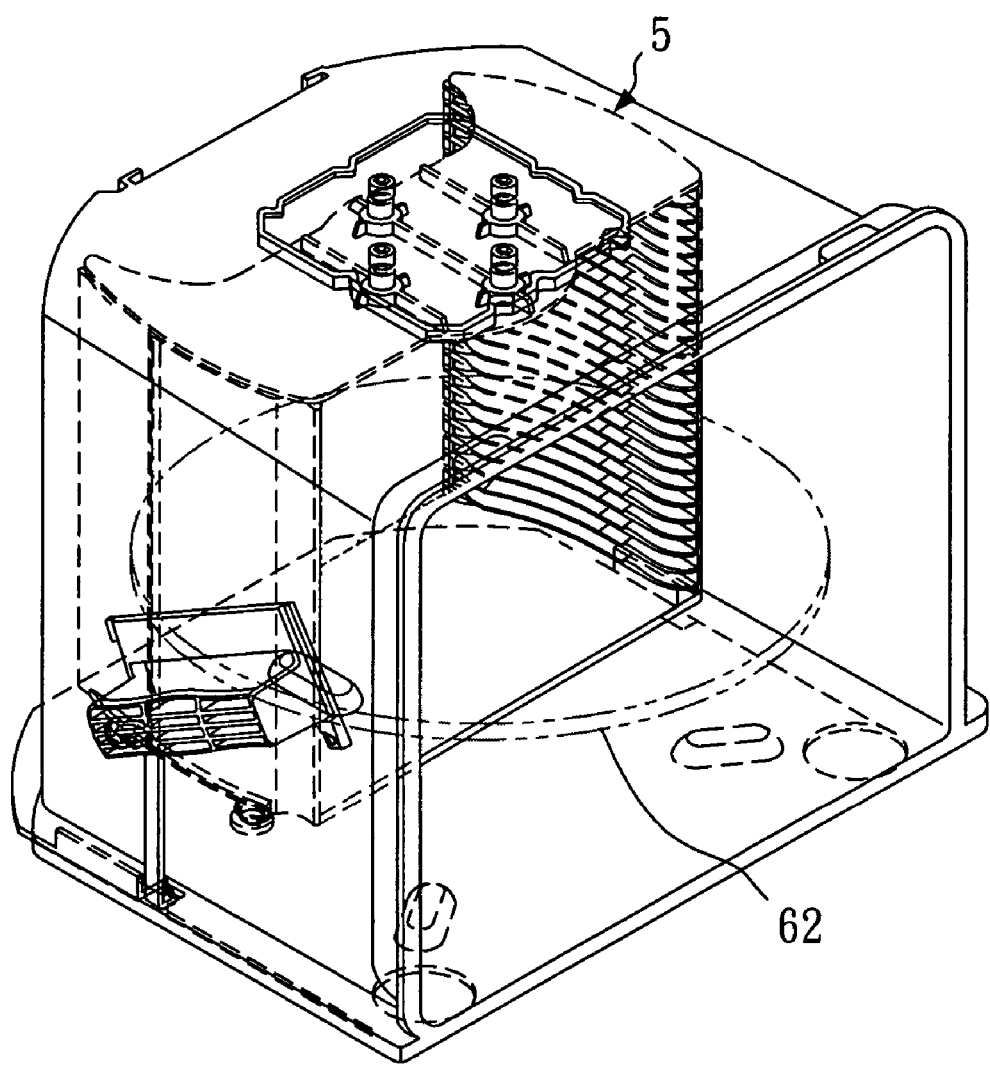
FIG. 6 is a perspective assembly view of the clean container module according to the second embodiment of the present invention.

FIG. 5 and FIG. 6 show an alternate form of the clean container module according to the present invention. This embodiment is substantially similar to the embodiment shown in FIG. 2~FIG. 4 with the exception that of the design of the rack for wafers 62. According to this embodiment, the rack, referenced by 5, comprises a horizontal top panel 51, two upright side panels 52, and a horizontal bottom panel 53. The horizontal bottom panel 53 has two distal ends respectively connected to the bottom side 521 of each of the two upright side panels 52. Preferably, the horizontal top panel 51, the two upright side panels 52 and the horizontal bottom panel 53 are formed in integrity. Alternatively, the horizontal top panel 51, the two upright side panels 52 and the horizontal bottom panel 53 can be separately made and then fastened together.

Although the present invention has been explained in relation to its preferred embodiments, it is to be understood that many other possible modifications and variations can be made without departing from the spirit and scope of the invention as hereinafter claimed.

What is claimed is:

1. A clean container module comprising:
    a container body, said container body comprising an inside receiving chamber, a front opening in communication with said inside receiving chamber, a top panel, and a bottom panel, the top panel and the bottom panel of said container body each including a plurality of through holes in communication with said inside receiving chamber respectively;
    a rack mounted inside the inside receiving chamber of said container body, said rack comprising a horizontal second top panel and two upright side panels perpendicularly downwardly extended from two distal ends of the horizontal second top panel of said rack, the horizontal second top panel of said rack including a plurality of upper rack mounting devices, the two upright side panels of said rack each including an inner side, a plurality of horizontal insertion slots arranged at different elevations at said inner side, a bottom side, and a plurality of lower rack mounting devices downwardly extended from said bottom side;
    a top access board provided above the top panel of said container body, said top access board comprising a plurality of first fastening devices respectively inserted through the corresponding through holes of the top panel of said container body and respectively fastened to the corresponding upper rack mounting devices of the horizontal second top panel of said rack; and
    a bottom access board provided below the bottom panel of said container body, said bottom access board comprising a plurality of second fastening devices symmetrically disposed near two opposite lateral sides thereof and respectively inserted through the corresponding through holes of the bottom panel of said container body and respectively fastened to the corresponding lower rack mounting devices of the two upright side panels of said rack.

2. The clean container module as claimed in claim 1, wherein the two upright side panels of said rack are respectively formed integral with the two distal ends of the horizontal second top panel of said rack.

3. The clean container module as claimed in claim 1, wherein each of the upper rack mounting devices of the horizontal second top panel of said rack comprises a screw hole; each of the first fastening devices of said top access board comprises a through hole formed in said top access board, and a screw bolt inserted through the through hole of the respective first fastening device and the corresponding through hole at the top panel of said container body and threaded into the corresponding screw hole of the upper rack mounting devices of the horizontal second top panel of said rack.

4. The clean container module as claimed in claim 1, wherein each of the lower rack mounting devices of the two upright side panels of said rack comprises a screw hole; each of the second fastening devices of said bottom access board comprises a through hole formed in said bottom access board, and a screw bolt inserted through the through hole of the respective second fastening device and the corresponding through hole at the bottom panel of said container body and threaded into the corresponding screw hole of the lower rack mounting devices of one of the upright side panels of said rack.

5. The clean container module as claimed in claim 1, further comprising a plurality of O-rings respectively mounted in between the first fastening devices of said top access board and the upper rack mounting devices of the horizontal second top panel of said rack and in between the second fastening devices of said bottom access board and the lower rack mounting devices of the two upright side panels of said rack.

6. The clean container module as claimed in claim 1, wherein the horizontal second top panel of said rack has at least two retaining holes symmetrically disposed near two distal ends thereof; the two upright side panels of said rack each have a top side and at least one retaining hook respectively upwardly extended from the top side and respectively hooked in the corresponding retaining hole at the horizontal second top panel of said rack.

7. The clean container module as claimed in claim 1, wherein said rack, said top access board and said bottom access board are respectively made of a conductive material.

8. The clean container module as claimed in claim 1, wherein said container body further comprises a left-side panel, a right-side panel, a left-side handle provided at an outer side of said left-side panel, and a right-side handle provided at an outer side of said right-side panel.

9. The clean container module as claimed in claim 8, wherein said container body further comprises a left-side grounding member connected between said left-side handle and said bottom access board, and a right-side grounding member connected between said right-side handle and said bottom access board.

10. The clean container module as claimed in claim 9, wherein said left-side handle, said right-side handle, said left-side grounding member and said right-side grounding member are respectively made of a conductive material.

11. A clean container module comprising:
    a container body, said container body comprising an inside receiving chamber, a front opening in communication with said inside receiving chamber, a top panel, and a bottom panel, the top panel and the bottom panel of said container body each including a plurality of through holes in communication with said inside receiving chamber respectively;

a rack mounted inside the inside receiving chamber of said container body, said rack comprising a horizontal second top panel, a horizontal second bottom panel, and two upright side panels respectively vertically connected between two distal ends of the horizontal second top panel of said rack and two distal ends of the horizontal second bottom panel of said rack respectively, the horizontal second top panel of said rack including a plurality of upper rack mounting devices, the two upright side panels of said rack each including an inner side, a plurality of horizontal insertion slots arranged at different elevations at said inner side, a bottom side, and a plurality of lower rack mounting devices downwardly extended from said bottom side;

a top access board provided above the top panel of said container body, said top access board comprising a plurality of first fastening devices respectively inserted through the corresponding through holes of the top panel of said container body and respectively fastened to the corresponding upper rack mounting devices of the horizontal second top panel of said rack; and a bottom access board provided below the bottom panel of said container body, said bottom access board comprising a plurality of second fastening devices symmetrically disposed near two opposite lateral sides thereof and respectively inserted through the corresponding through holes of the bottom panel of said container body and respectively fastened to the corresponding lower rack mounting devices of the two upright side panels of said rack.

12. The clean container module as claimed in claim 11, wherein the horizontal second top panel, upright side panels, and horizontal second bottom panel of said rack are formed integral with one another.

13. The clean container module as claimed in claim 11, wherein each of the upper rack mounting devices of the horizontal second top panel of said rack comprises a screw hole; each of the first fastening devices of said top access board comprises a through hole formed in said top access board, and a screw bolt inserted through the through hole of the respective first fastening device and the corresponding through hole at the top panel of said container body and threaded into the corresponding screw hole of the mounting devices of the horizontal second top panel of said rack.

14. The clean container module as claimed in claim 11, wherein each of the lower rack mounting devices of the two upright side panels of said rack comprises a screw hole; each of the second fastening devices of said bottom access board comprises a through hole formed in said bottom access board, and a screw bolt inserted through the through hole of the respective second fastening device and the corresponding through hole at the bottom panel of said container body and threaded into the corresponding screw hole of the lower rack mounting devices of one of the upright side panels of said rack.

15. The clean container module as claimed in claim 11, further comprising a plurality of O-rings respectively mounted in between the first fastening devices of said top access board and the upper rack mounting devices of the horizontal second top panel of said rack and in between the second fastening devices of said bottom access board and the lower rack mounting devices of the two upright side panels of said rack.

16. The clean container module as claimed in claim 11, wherein the horizontal second top panel of said rack has at least two retaining holes symmetrically disposed near two distal ends thereof the two upright side panels of said rack each have a top side and at least one retaining hook respectively upwardly extended from the top side and respectively hooked in the corresponding retaining hole at the horizontal second top panel of said rack.

17. The clean container module as claimed in claim 11, wherein said rack, said top access board and said bottom access board are respectively made of a conductive material.

18. The clean container module as claimed in claim 11, wherein said container body further comprises a left-side panel, a right-side panel, a left-side handle provided at an outer side of said left-side panel, and a right-side handle provided at an outer side of said right-side panel.

19. The clean container module as claimed in claim 18, wherein said container body further comprises a left-side grounding member connected between said left-side handle and said bottom access board, and a right-side grounding member connected between said right-side handle and said bottom access board.

20. The clean container module as claimed in claim 19, wherein said left-side handle, said right-side handle, said left-side grounding member and said right-side grounding member are respectively made of a conductive material.

* * * * *